United States Patent
Antonacci et al.

(10) Patent No.: US 9,013,167 B2
(45) Date of Patent: Apr. 21, 2015

(54) HALL EFFECT DEVICE HAVING VOLTAGE BASED BIASING FOR TEMPERATURE COMPENSATION

(75) Inventors: Anthony G. Antonacci, Allen, TX (US);
Keith R. Green, Prosper, TX (US);
Borna J. Obradovic, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 409 days.

(21) Appl. No.: 12/942,529

(22) Filed: Nov. 9, 2010

(65) Prior Publication Data
US 2012/0112733 A1 May 10, 2012

(51) Int. Cl.
G01R 19/32 (2006.01)
G01R 33/07 (2006.01)
G01R 33/00 (2006.01)

(52) U.S. Cl.
CPC .......... G01R 33/072 (2013.01); G01R 33/0029 (2013.01)

(58) Field of Classification Search
CPC ............. H03H 1/00; G05F 1/575; G05F 1/56; G05F 1/63; G05F 1/648; G01R 19/32; G05B 11/013; H02P 9/22; G01C 17/26; G01P 3/465
USPC ............ 323/274, 281, 293–298, 368; 32/274, 32/281, 293–298, 368; 322/DIG. 5
See application file for complete search history.

(56) References Cited

U.S. PATENT DOCUMENTS

| | | | |
|---|---|---|---|
| 3,448,353 A | 6/1969 | Gallagher et al. | |
| 3,613,021 A | 10/1971 | Scheidt | |
| 4,449,081 A | 5/1984 | Doemen | |
| 4,634,961 A | 1/1987 | Popovic et al. | |
| 4,760,285 A | 7/1988 | Nelson | |
| 4,833,406 A | 5/1989 | Foster | |
| 5,017,804 A * | 5/1991 | Harnden et al. | 327/511 |
| 5,055,768 A * | 10/1991 | Plagens | 323/368 |
| 5,218,279 A | 6/1993 | Takahashi et al. | |
| 5,260,614 A | 11/1993 | Theus et al. | |
| 5,406,202 A | 4/1995 | Mehrgardt et al. | |
| 5,426,364 A * | 6/1995 | Yi | 324/251 |
| 5,548,151 A | 8/1996 | Funaki et al. | |

(Continued)

FOREIGN PATENT DOCUMENTS

| | | |
|---|---|---|
| JP | 06265586 | 9/1994 |
| JP | 10253728 | 9/1998 |

OTHER PUBLICATIONS

AH6851 Hall-Effect Switch Integrated Circuits; Hall Sensors; pp. 1-2; Nanjing Ah Electronic Co., Ltd.; Nanjing, P.R.China.

(Continued)

*Primary Examiner* — Jessica Han
*Assistant Examiner* — Gustavo Rosario Benitez
(74) *Attorney, Agent, or Firm* — William B. Kempler; Frank D. Cimino

(57) ABSTRACT

A Hall effect device includes a Hall element and a voltage regulator. The Hall element has first and second bias terminals, or nodes. The Hall effect device maintains, or regulates, a voltage at a point within the Hall element between the first and second bias terminals at about a constant voltage level, while generating a Hall effect voltage. In particular embodiments, the Hall effect voltage is, thus, prevented from substantially varying with the temperature of the Hall element.

12 Claims, 5 Drawing Sheets

(56) References Cited

U.S. PATENT DOCUMENTS

| | | | |
|---|---|---|---|
| 5,550,469 | A | 8/1996 | Tanabe et al. |
| 5,686,827 | A * | 11/1997 | Ward ............................ 323/368 |
| 5,818,225 | A * | 10/1998 | Miekley et al. ............... 324/251 |
| 6,154,027 | A * | 11/2000 | Alexander et al. ............ 324/251 |
| 6,825,709 | B2 | 11/2004 | Motz |
| 7,042,208 | B1 | 5/2006 | Harris |
| 7,112,950 | B2 | 9/2006 | Reinhold et al. |
| 7,339,245 | B2 | 3/2008 | Mueller |
| 2005/0190507 | A1 | 9/2005 | Littlewood et al. |
| 2008/0088298 | A1 | 4/2008 | Haddab et al. |
| 2009/0009164 | A1 * | 1/2009 | Utsuno ......................... 324/251 |

OTHER PUBLICATIONS

Hall effect sensor; Wikipedia, the free encyclopedia; http://en.wikipedia.org/wiki/Hall_effect_sensor; Jul. 21, 2010; pp. 1-3; Wikipedia.

Dual, 2-Wire Hall-Effect Sensor Interface with Diagnostics; MAX9921; Jan. 2010; pp. 1-16; 19-4119; Rev 1; Maxim Integrated Products, Inc.; Sunnyvale, CA.

PCT Search Report mailed Jun. 28, 2012.

* cited by examiner

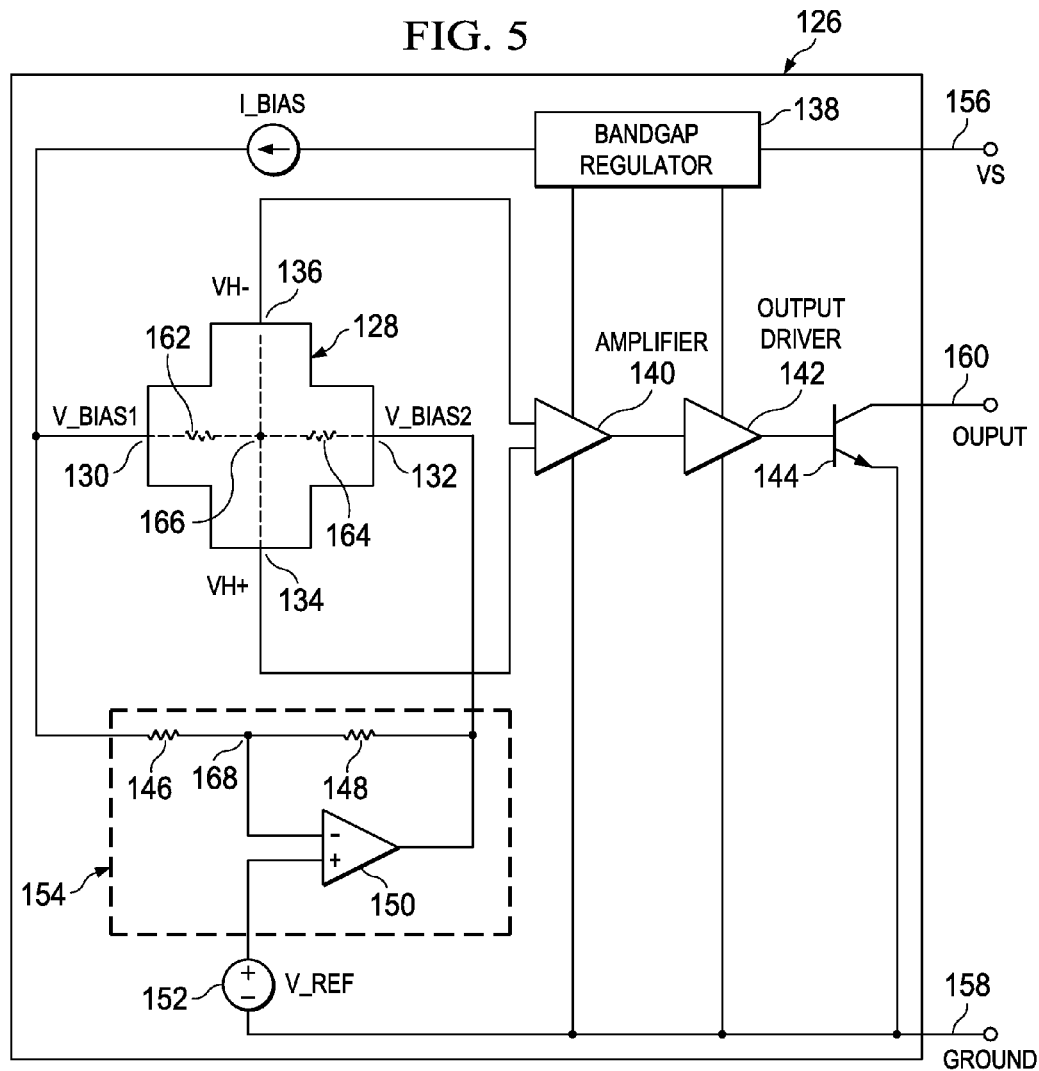

HALL EFFECT DEVICE HAVING VOLTAGE BASED BIASING FOR TEMPERATURE COMPENSATION

BACKGROUND OF THE INVENTION

Hall effect devices are typically used to sense the presence, and sometimes the magnitude, of a magnetic field. A simplified schematic of a basic Hall effect device 100 is shown in FIG. 1 to illustrate the basic concept thereof.

The Hall effect device 100 generally has a Hall element, or plate, 102 through which a bias current (I_bias) is passed from a first bias terminal, or node, 104 to a second bias terminal 106. When the bias current I_bias is applied in the presence of a magnetic field perpendicular to the plane of the Hall element 102, the Lorenz force acting on the majority carriers in the Hall element 102 generates a "Hall voltage" (VH+ to VH−) in the form of an offset voltage across Hall voltage terminals 108 and 110. The Hall voltage is typically relatively small, so an amplifier 112 is commonly used to enhance the output (VH+ to VH−) of the Hall element 102. The output of the amplifier 112 may form the output of the overall Hall effect device 100 as an analog signal indicative of the strength of the magnetic field perpendicular to the Hall element 102. Alternatively, the output of the amplifier 112 may pass to an output driver 114 (such as a Schmitt Trigger) to drive an output transistor 116, which produces a binary (i.e. on/off, yes/no, true/false) output signal indicative of whether the Hall effect device 100 is within a magnetic field sufficient to trigger the output signal.

Additionally, a supply voltage VS is provided to the Hall effect device 100 to power the components thereof, typically through a bandgap regulator 118. Including a ground, the Hall effect device 100 is, thus, typically a three-pin component.

A problem with Hall effect devices (e.g. 100) is that the output voltage (VH+ to VH−) of the Hall element 102 typically varies with the temperature of the Hall element 102. Graphs 120, 122 and 124 in FIGS. 2, 3 and 4, respectively, illustrate this phenomenon, commonly called "temperature drift." (The values shown in the graphs 120, 122 and 124 are typical for some situations, but are shown for illustrative purposes only.)

The voltage (V_bias1) at the first bias terminal 104 increases with temperature, while the voltage (V_bias2) at the second bias terminal 106 is generally fixed, relative to ground, as shown in FIG. 2. The voltage across the bias terminals 104 and 106, thus, increases with increasing temperature, as shown in FIG. 3. This change in voltage across the bias terminals 104 and 106 is generally due to a characteristic change of resistance in the material of the Hall element 102 over the illustrated temperature range, while the bias current I_bias is held relatively constant. The increase in the voltage V_bias1 at one of the bias terminals 104 results in an overall increase in the net velocity of the majority carriers in the material of the Hall element 102 due to the temperature change. Consequently, the Hall voltage (VH+ to VH−) also increases with temperature, as shown in FIG. 4.

With the values shown in FIGS. 2-4, the change in temperature results in about a five percent change in the Hall voltage (VH+ to VH−) over the given temperature range. Such a variation in the Hall voltage (VH+ to VH−) is unacceptably large for many applications.

Manufacturers of Hall effect devices have developed a variety of techniques for compensating for temperature drift. Such techniques have employed a variety of digital algorithms for adjusting the Hall voltage based on a measured temperature, various methods for modulating the bias current (so it is not a constant current) and diverse analog circuits for fine-tuning the output Hall voltage, among other techniques. Because of the need for additional components (not shown in FIG. 1) to perform the temperature compensation, these techniques have various tradeoffs with respect to advantages and disadvantages regarding size, complexity and cost of the Hall effect devices. Due to the very common usage of these devices in a wide variety of applications, it is highly desirable to develop smaller, simpler and cheaper Hall effect devices.

It is with respect to these and other background considerations that the present invention has evolved.

SUMMARY OF THE INVENTION

According to some embodiments of the present invention, a Hall effect device that sufficiently compensates for temperature drift, but is generally smaller, simpler and/or cheaper than that discussed above, preferably includes a Hall element and a voltage regulator that regulates a voltage at a point within the Hall element between bias terminals thereof to about a constant value. Additionally, according to some embodiments of the present invention, a method for generating a Hall effect voltage generally involves applying a substantially constant bias current through a Hall element; maintaining a voltage at a point within the Hall element between bias nodes thereof at about a constant voltage level; and generating the Hall effect voltage by the Hall element when in the presence of a magnetic field.

According to some more specific embodiments, as a temperature of the Hall element changes, an internal resistance thereof changes, which causes voltages at both bias terminals to change in a manner that prevents the Hall effect voltage from substantially varying with the temperature. Alternatively or additionally, the aforementioned point within the Hall element is preferably at about a center, or midpoint, between the bias terminals.

A more complete appreciation of the present disclosure and its scope, and the manner in which it achieves the above noted improvements, can be obtained by reference to the following detailed description of presently preferred embodiments taken in connection with the accompanying drawings, which are briefly summarized below, and the appended claims.

BRIEF DESCRIPTION OF THE DRAWINGS

FIG. 5 is a simplified schematic diagram of a Hall effect device, according to an embodiment of the present invention.

DETAILED DESCRIPTION OF THE INVENTION

Figure 1:
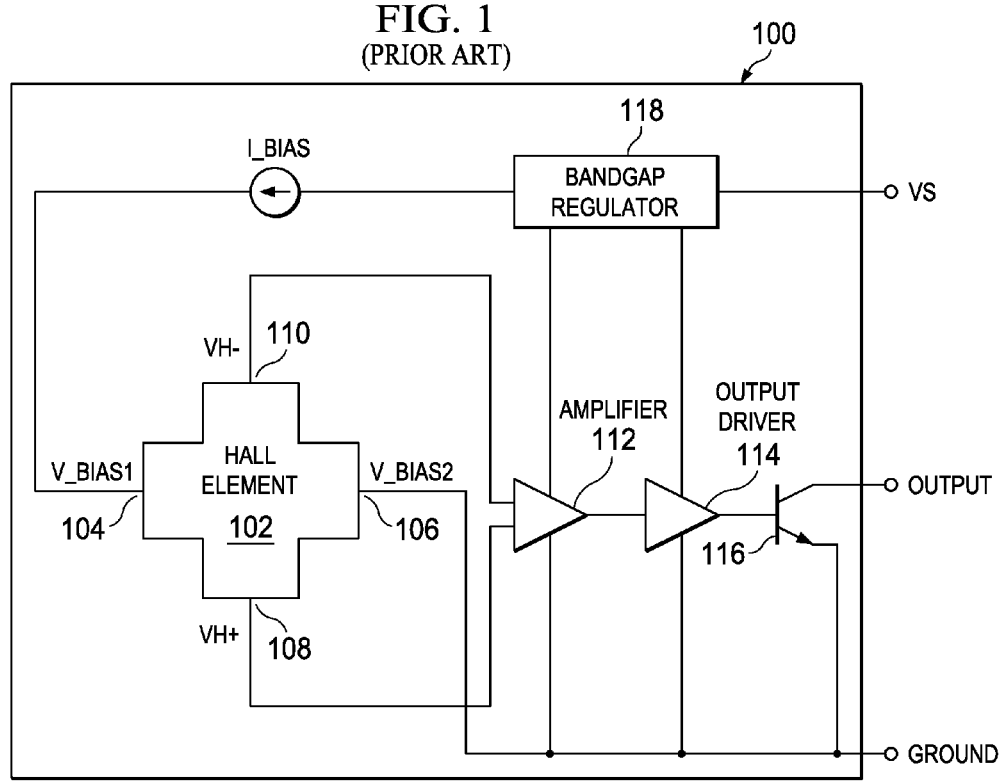
FIG. 1 is a simplified schematic diagram of a prior art Hall effect device.
Figure 2:
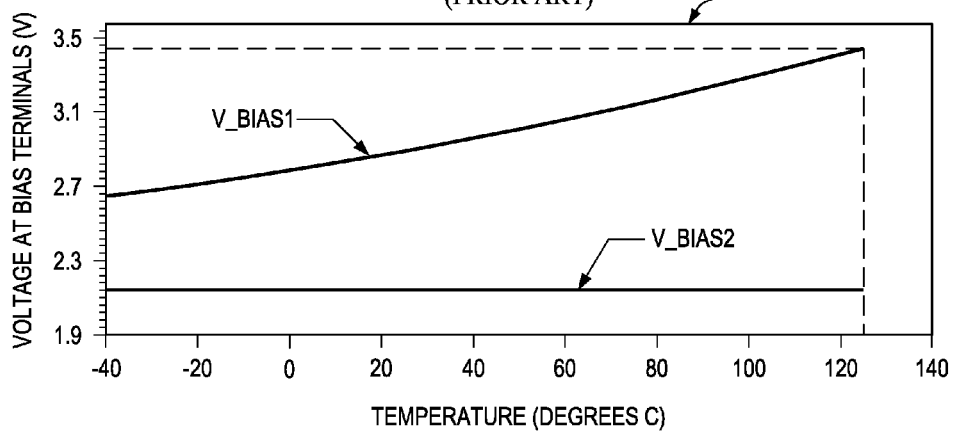
FIG. 2 is an example graph illustrating temperature dependence of voltages at bias terminals within a prior art Hall effect device.
Figure 3:
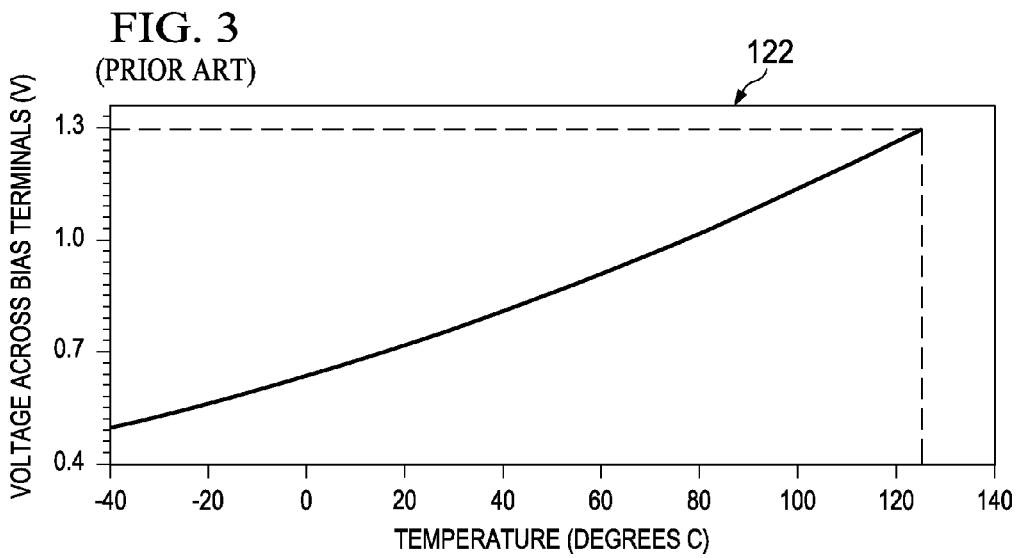
FIG. 3 is an example graph illustrating temperature dependence of a voltage across bias terminals within a prior art Hall effect device.

A Hall effect device 126, incorporating an embodiment of the present invention, is shown in FIG. 5. The Hall effect device 126 includes a Hall element 128 with bias terminals, or nodes, 130 and 132 and Hall voltage terminals, or nodes, 134 and 136. A substantially constant bias current is supplied through the bias terminals 130 and 132, which results in bias voltages V_bias1 and V_bias2 at the bias terminals 130 and 132, due to an internal resistance of the Hall element 128. In the presence of a magnetic field perpendicular to the plane of the Hall element 128, the Lorenz force causes majority carriers in the Hall element 128 to generate a Hall voltage (i.e. offset voltage VH+ to VH−) across the Hall voltage terminals 134 and 136. Additionally, the internal resistance of the Hall element 128 changes with the temperature thereof. As described below, however, the Hall effect device 126 adjusts, or regulates, the level of the bias voltages V_bias1 and V_bias2 at both bias terminals 130 and 132 as the temperature of the Hall element 128 changes, while the bias current supplied through the bias terminals 130 and 132 is held substantially constant. The changes to the bias voltages V_bias1 and V_bias2, in the presence of the magnetic field, affect the velocity of the majority carriers in the Hall element 128 between the Hall voltage terminals 134 and 136. However, the bias voltages V_bias1 and V_bias2 are adjusted or regulated in such a manner that the net change in velocity of the majority carriers throughout the Hall element 128 is substantially zero, or negligible. Consequently, the Hall voltage (VH+ to VH−) does not vary substantially with temperature variation. In other words, the present invention prevents temperature drift in the Hall voltage (VH+ to VH−) with, as explained below, a solution that has a relatively small size, low complexity and minimal cost.

According to the illustrated embodiment, in addition to the Hall element 128, the Hall effect device 126 generally includes a bandgap regulator 138, an amplifier 140, an optional output driver (such as a Schmitt Trigger) 142, an optional output transistor 144, first and second series resistors (external to the Hall element 128) 146 and 148, a high gain amplifier 150 and a reference voltage source 152, among other potential components (not shown for simplicity), connected as shown in FIG. 5 and described below. (The first and second resistors 146 and 148 and the high gain amplifier 150 generally form a voltage regulator 154.) Inputs to the Hall effect device 126 preferably include a source voltage VS at 156 and ground at 158. An output of the Hall effect device 126 is produced at 160. It is understood, however, that the present invention is not necessarily limited to the particular components in the particular configuration shown. Instead, other components and/or configurations thereof may be used to perform some of the described functions.

The Hall element 128 is made of a material that has a characteristic resistance between the bias terminals 130 and 132 that is schematically represented by first and second internal series resistors 162 and 164. (This resistance typically increases with increasing temperature of the Hall element 128.) For the schematic representation, the internal resistors 162 and 164 preferably have the same resistance, i.e. each is half of the total internal resistance. Thus, a point 166 shown between the internal resistors 162 and 164 is generally a midpoint or center point between the bias terminals 130 and 132, due to a voltage divider formed by the internal resistors 162 and 164.

The external resistors 146 and 148 are in series with each other, so the external resistors 146 and 148 form another voltage divider. Together, the external resistors 146 and 148 are arranged in parallel with the Hall element 128 (i.e. the internal series resistors 162 and 164) between the bias terminals 130 and 132. The bias current I_bias is, thus, supplied to the parallel configuration of the external resistors 146 and 148 and the Hall element 128.

In some embodiments, the resistance of the external resistors 146 and 148 is at least an order of magnitude (and preferably two to four orders of magnitude) greater than the internal resistance (i.e. the resistors 162 and 164) of the Hall element 128. Therefore, most of the bias current I_bias passes through the Hall element 128 in order to contribute to the generation of the Hall voltage (VH+ to VH−).

In some embodiments, the external resistors 146 and 148 are preferably made of the same material as the Hall element 128. Therefore, a change in the temperature of the Hall effect device 126 will affect the external resistors 146 and 148 and the Hall element 128 equally. In other words, as the resistance of the Hall element 128 changes with temperature, the resistance of the external resistors 146 and 148 changes in the same manner, so the ratio of the resistance of the Hall element 128 to the resistance of the external resistors 146 and 148 remains almost the same. In this manner, the portion of the bias current I_bias that passes through the Hall element 128 is held substantially constant as long as the bias current I_bias is held substantially constant.

Additionally, in some embodiments, both external resistors 146 and 148 preferably have substantially the same resistance. Therefore, the voltage at a node 168 between the external resistors 146 and 148 is substantially the same as the voltage at the midpoint 166 between the internal resistors 162 and 164 (i.e. between the bias terminals 130 and 132) of the Hall element 128. Additionally, the voltage at the midpoint 166 or at the node 168 is, thus, the average of the voltages at the bias terminals 130 and 132.

The high gain amplifier 150 is connected at a negative input to the node 168 between the external resistors 146 and 148 and at a positive input to the reference voltage source 152. (The reference voltage source 152 produces a temperature-independent reference voltage V_ref.) The output of the high gain amplifier 150 is connected to the bias terminal 132 of the Hall element 128. The Hall element 128 and the external resistors 146 and 148, thus, form a feedback loop for the high gain amplifier 150 to regulate the voltage at the node 168 between the external resistors 146 and 148 to about the voltage level of the reference voltage V_ref. Additionally, since the voltage at the node 168 is substantially the same as the voltage at the midpoint 166 between the bias terminals 130 and 132 of the Hall element 128, the high gain amplifier 150 also, in effect, regulates the voltage at the midpoint 166 to about the voltage level of the reference voltage V_ref. In other words, the bias voltages V_bias1 and V_bias2 at the bias terminals 130 and 132, respectively, are allowed to "float", while the voltage regulator 154 adjusts up and down the bias voltages V_bias1 and V_bias2 in such a manner that the average thereof remains substantially constant at about the reference voltage V_ref.

Since one of the bias voltages V_bias1 and V_bias2 is increased and the other is lowered (in response to a change in temperature) in such a manner that the average thereof remains substantially constant, the net effect on the change in the velocity of the majority carriers throughout the Hall element 128 is almost zero, so the Hall voltage (VH+ to VH−) is substantially unchanged. This effect occurs primarily for the following reasons: There is a reduced "drain" to substrate voltage compared to the prior art example (FIG. 1), even though the differential voltage across the bias terminals 130 and 132 may be about the same as in the prior art. As a result, across the length (from bias terminal 130 to bias terminal 132) of the Hall element 128, there is a counterbalancing of the induced change in thickness of the space-charge zone which is not the case for the Hall element 102 (FIG. 1) in the prior art Hall effect device 100 under similar conditions. There is, thus, a significantly reduced sensitivity to the differential voltage across the bias terminals 130 and 132 and to temperature variation, compared to that for the prior art example, as has been discovered through circuit and device level simulations.

Graphs 170-182 of FIGS. 6-12 illustrate the function of an example of the Hall effect device 126, according to an embodiment of the present invention, generated through a computer simulation using similar parameters as the prior art example described above with reference to FIGS. 1-4 for comparison. Each graph 170-182 is produced over a temperature range from about −40 degrees C. to about 125 degrees C. with a substantially constant magnetic field. The simulation also assumes that the reference voltage source 152 is "ideal", i.e. having no temperature dependency (such as a bangap reference). It is understood that the values shown in the graphs 170-182 for the temperature and the various simulation results are for illustrative purposes only, and do not limit the present invention.

Figure 6:
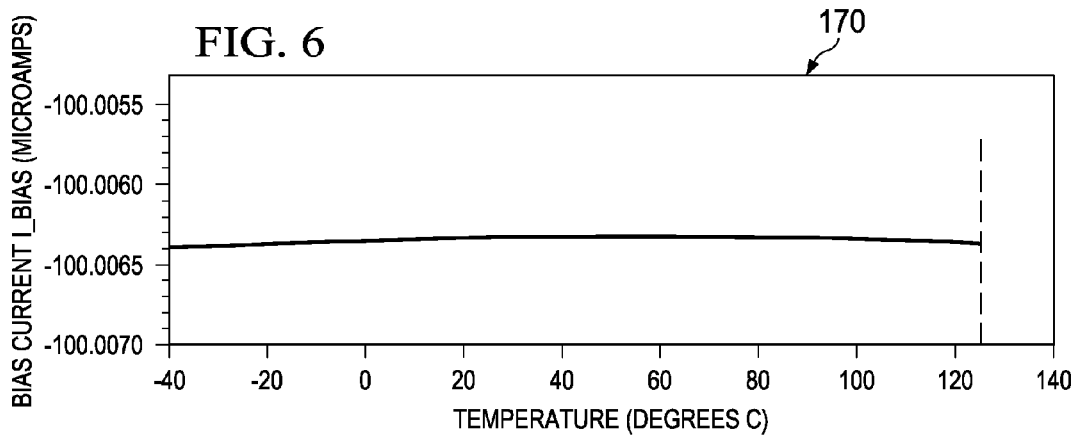
FIG. 6 is an example graph illustrating temperature dependence of a bias current used in the Hall effect device shown in FIG. 5, according to an embodiment of the present invention.

The graph 170 in FIG. 6 shows a slight variation of the bias current I_bias over the temperature range for this example. Ideally, the bias current I_bias would be held constant. Under real world conditions, however, the bias current I_bias is simply held "substantially" constant, i.e. within an acceptable range. The bias current I_bias in this example varies no more than about 0.00007% over the temperature range. Such variation is well within acceptable limits to be considered substantially constant.

Figure 7:
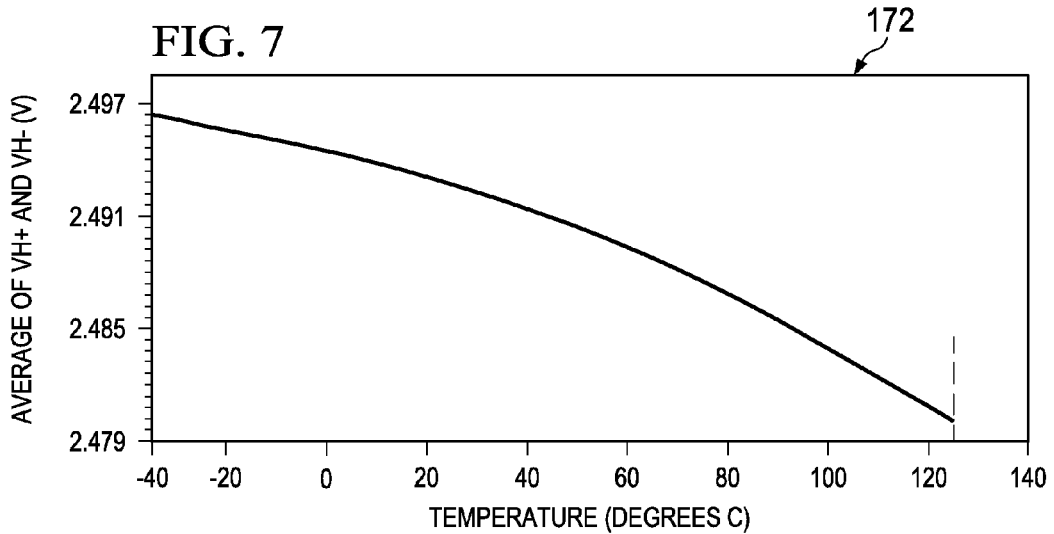
FIG. 7 is an example graph illustrating temperature dependence of a midpoint voltage within the Hall effect device shown in FIG. 5, according to an embodiment of the present invention.

The graph 172 in FIG. 7 shows a variation of the average of the voltages at the Hall voltage terminals 134 and 136, VH+ and VH−, respectively, over the example temperature range. Ideally, the average of the voltages at the Hall voltage terminals 134 and 136 would be regulated to be constant with respect to ground. However, the average of the voltages at the Hall voltage terminals 134 and 136 varies in this example between about 2.496 volts and about 2.480 volts for about a 0.675% variation over temperature, primarily due to practical imperfections in the circuit, such as an offset in the high gain amplifier 150 and leakage currents. Again, under real world conditions, this variation is within acceptable limits to be considered substantially constant.

Figure 8:
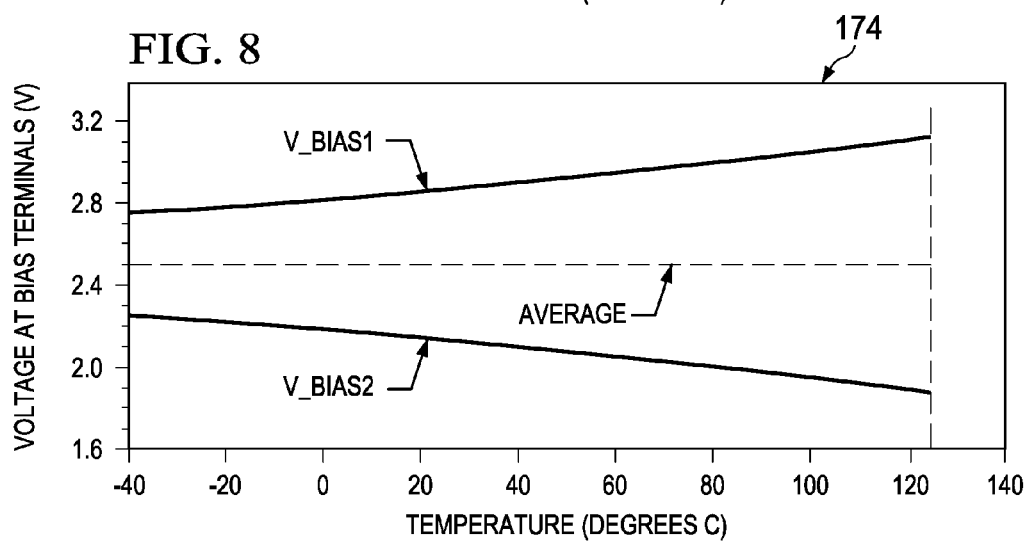
FIG. 8 is an example graph illustrating temperature dependence of voltages at bias terminals within the Hall effect device shown in FIG. 5, according to an embodiment of the present invention.

With the bias current I_bias shown in FIG. 6 as the input to the Hall element 128 and the reference voltage V_ref as the input to the high gain amplifier 150, the bias voltages V_bias1 and V_bias2 at the bias terminals 130 and 132, respectively, that result for this example are as shown in the graph 174 of FIG. 8. The first bias voltage V_bias1 at the first bias terminal 130 rises about 0.37 volts from about 2.75 volts to about 3.12 volts, and the second bias voltage V_bias2 at the second bias terminal 132 lowers about 0.38 volts from about 2.25 volts to about 1.87 volts, as the temperature increases across the temperature range. Compared to the prior art example in FIG. 2, the first bias voltage V_bias1 rises by a smaller amount in the example incorporating an embodiment of the present invention than it does in the prior art example. Additionally, the second bias voltage V_bias2 decreases in the example incorporating an embodiment of the present invention, instead of remaining almost constant, as it does in the prior art example. On the other hand, the average of the bias voltages V_bias1 and V_bias2 (horizontal dashed line) in the example incorporating an embodiment of the present invention is held substantially constant at almost 2.50 volts.

Figure 9:
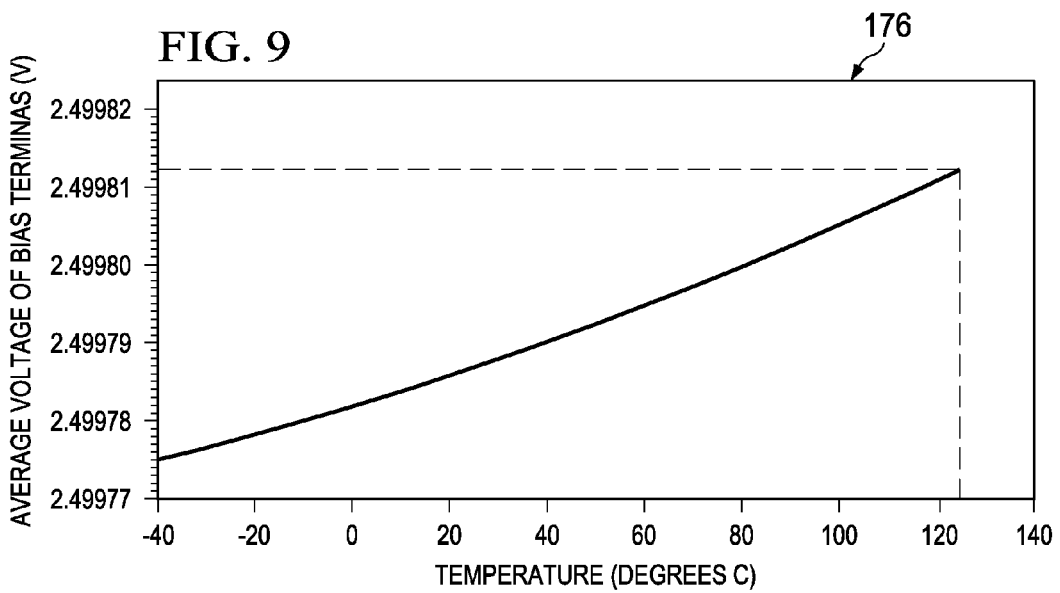
FIG. 9 is an example graph illustrating temperature dependence of an average of voltages at bias terminals within the Hall effect device shown in FIG. 5, according to an embodiment of the present invention.

The average of the bias voltages V_bias1 and V_bias2 (horizontal dashed line in FIG. 8) is shown at a finer scale in the graph 176 of FIG. 9. Even though the average of the bias voltages V_bias1 and V_bias2 is seen to increase with increasing temperature over the temperature range, the variation of the average of the bias voltages V_bias1 and V_bias2 is only about 0.0015%. Such variation is well within acceptable limits to be considered substantially constant.

Figure 10:
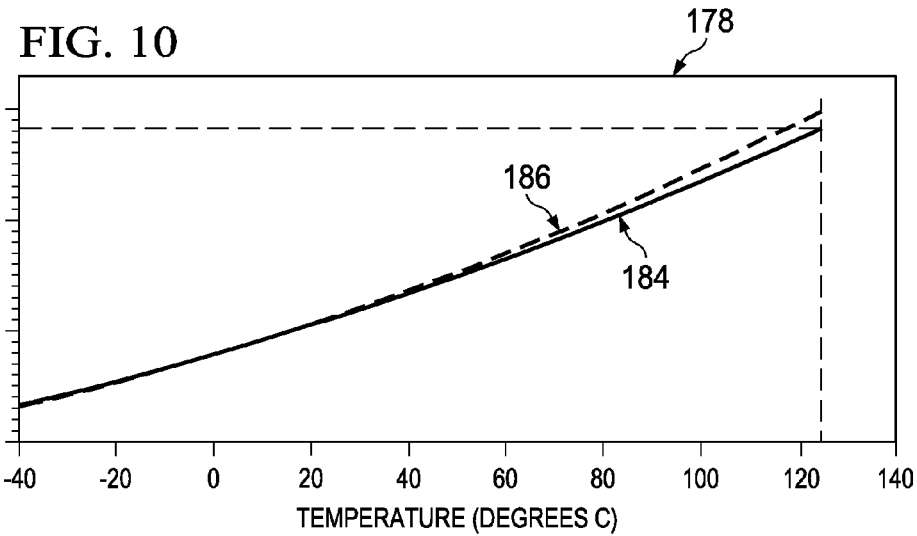
FIG. 10 is an example graph illustrating temperature dependence of a voltage across bias terminals within the Hall effect device shown in FIG. 5, according to an embodiment of the present invention.

The voltage across the bias terminals 130 and 132 (i.e. the differential between the bias voltages V_bias1 and V_bias2) for the example incorporating an embodiment of the present invention (solid line 184) and for the prior art example (dashed line 186, see also FIG. 3) is shown in FIG. 10. The differential voltage for the example incorporating an embodiment of the present invention (solid line 184) increases with increasing temperature from about 0.50 volts to about 1.25 volts and is very similar to that for the prior art example (dashed line 186), although the lines 184 and 186 begin to diverge at the higher temperatures. The difference between the two lines 184 and 186 at the high temperatures is primarily due to the fact that the current density through the Hall element 128 is not exactly the same in both simulations, since the external resistors 146 and 148 provide a (relatively small) leakage path around the Hall element 128, which does not occur in the prior art example. Nevertheless, the two lines 184 and 186 are sufficiently similar within acceptable limits.

Figure 11:
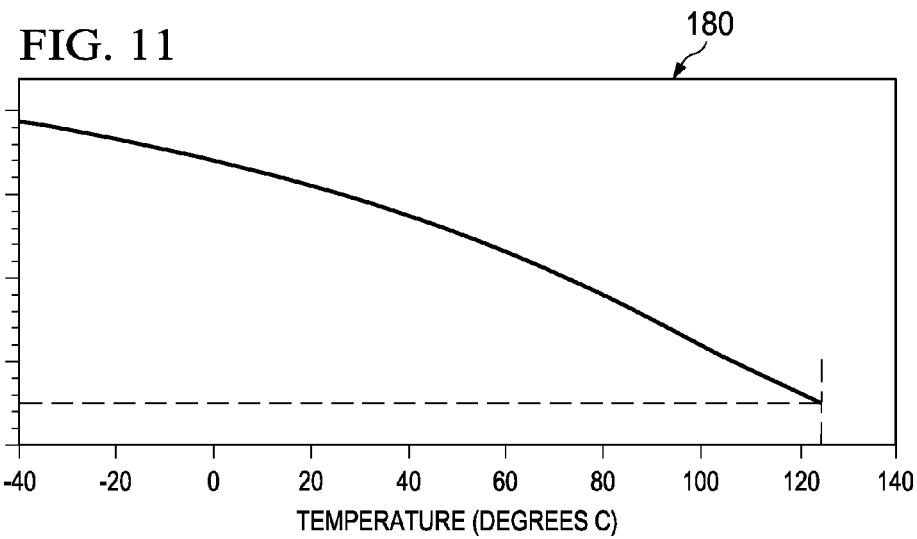
FIG. 11 is an example graph illustrating temperature dependence of a Hall voltage within the Hall effect device shown in FIG. 5, according to an embodiment of the present invention.

The generated Hall voltage (VH+ to VH−) for the example incorporating an embodiment of the present invention is shown in FIG. 11. The Hall voltage in this example generally decreases from about 1.60794 mV to about 1.60625 mV as the temperature increases across the range. The temperature drift of the generated Hall voltage over the temperature range is, thus, about 0.1%. Such variation is well within acceptable limits to be considered substantially constant.

Figure 4:
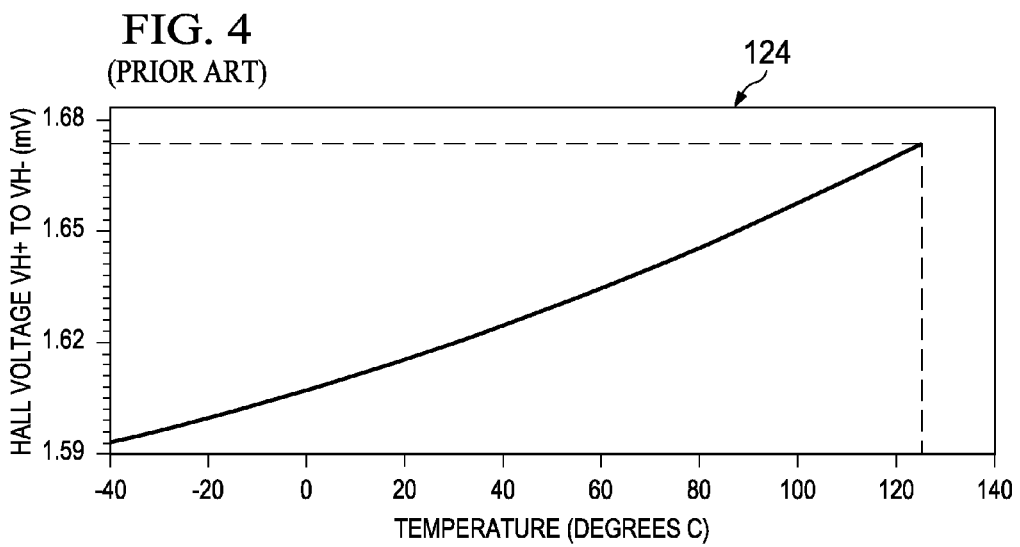
FIG. 4 is an example graph illustrating temperature dependence of a Hall voltage within a prior art Hall effect device.
Figure 12:
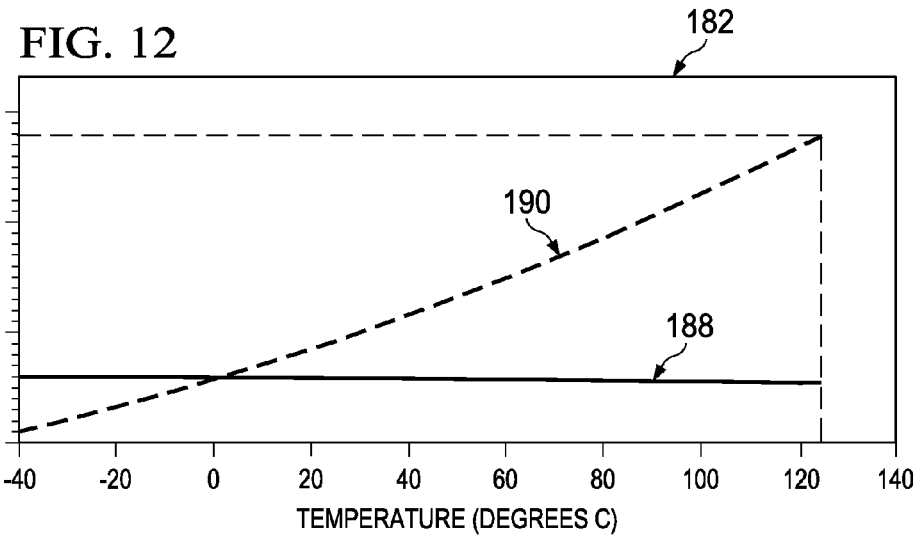
FIG. 12 is an example graph comparing temperature dependence of a Hall voltage within the Hall effect device shown in FIG. 5, according to an embodiment of the present invention, with an example graph illustrating temperature dependence of a Hall voltage within a prior art Hall effect device.

In FIG. 12, the Hall voltage for the example incorporating an embodiment of the present invention (solid line 188) is shown alongside the Hall voltage for the prior art example (dashed line 190, see also FIG. 4) for comparison at the scale of the graph 124 in FIG. 4. At this scale, the Hall voltage for the example incorporating an embodiment of the present invention (solid line 188) appears almost horizontal (i.e. substantially constant) across the temperature range compared to the Hall voltage for the prior art example (dashed line 190).

The Hall voltage (VH+ to VH−) that is, thus, provided to the amplifier 140 (FIG. 5) is substantially temperature-independent and needs no further adjustment or fine-tuning for temperature compensation. The output of the amplifier 140 is preferably supplied to the output driver 142, which controls the output transistor 144 to produce the substantially temperature-independent digital output of the Hall effect device 126 at 160. Alternatively, the substantially temperature-independent analog output of the amplifier 140 may be produced at the output 160. Additionally, in either alternative, the voltage regulator 154 and the reference voltage source 152 represent relatively few and relatively small sets of components in the Hall effect device 126, so embodiments of the present invention can be implemented as relatively small, simple and cheap solutions to the problem of temperature drift.

Presently preferred embodiments of the present invention and its improvements have been described with a degree of particularity. This description has been made by way of preferred example. It should be understood, however, that the scope of the claimed subject matter is defined by the following claims, and should not be unnecessarily limited by the detailed description of the preferred embodiments set forth above.

The invention claimed is:

1. A Hall effect device comprising:
a Hall element having first and second bias terminals;
and a voltage regulator that regulates a voltage at a point within the Hall element between the first and second bias terminals to about a constant value, wherein:
the voltage regulator comprises first and second resistors;
the first and second resistors are connected in series with each other and connected to the first and second bias terminals so that they are in parallel with the Hall element; and
the voltage regulator regulates the voltage at the point within the Hall element by regulating a voltage at a node between the first and second resistors to about the constant value, wherein:
the voltage regulator further comprises a high gain amplifier; and
the high gain amplifier connects at a first input to a reference voltage, at a second input to the node between the first and second resistors and at an output to the second bias terminal of the Hall element and wherein the voltage at the node between the first and second resistor substantially equals the reference voltage and substantially equals the voltage at the point within the Hall element,
wherein: the Hall element has first and second Hall voltage terminals and generates a Hall effect voltage across the first and second Hall voltage terminals when in the presence of a magnetic field; and as a temperature of the Hall element changes, an internal resistance thereof changes, which causes voltages at the first and second bias terminals to change in opposite directions to remain substantially equidistant from the voltage at the point within the Hall element.

2. The Hall effect device of claim 1, wherein:
the point within the Hall element is close to a center of the Hall element and between the first and second bias terminals.

3. The Hall effect device of claim 1, wherein:
the point within the Hall element is close to a center of the Hall element and between the first and second bias terminals.

4. The Hall effect device of claim 1, wherein:
a resistance of the first resistor is about the same as a resistance of the second resistor.

5. The Hall effect device of claim 1 wherein:
resistances of the first and second resistors are at least an order of magnitude greater than an internal resistance of the Hall element.

6. The Hall effect device of claim 1 wherein:
the first and second resistors are made of a substantially same material as the Hall element.

7. A Hall effect device comprising:
a Hall element having first and second bias terminals, first and second Hall voltage terminals and an internal resistance between the first and second bias terminals;
a constant current source connected to the first bias terminal;
first and second resistors connected in series with each other and connected to the first and second bias terminals so that they are in parallel with the internal resistance of the Hall element, the first and second resistors having a resistance that is at least an order of magnitude greater than the internal resistance of the Hall element, the resistance of the first resistor being about the same as the resistance of the second resistor, and the first and second resistors being made of a material that is about the same as a material of the Hall element; and
a high gain amplifier connected at a first input to a temperature independent reference voltage, at a second input to a node between the first and second resistors and at an output to the second bias terminal of the Hall element;
and wherein in operation:
a substantially constant current is supplied through the parallel configuration of the first and second resistors with the internal resistance between the first and second bias terminals of the Hall element;
the configuration of the high gain amplifier and the first and second resistors and the internal resistance between the first and second bias terminals of the Hall element form a feedback loop that regulates a voltage at the node between the first and second resistors to about the reference voltage;
the voltage at the node between the first and second resistors is about the same as a voltage at a center of the internal resistance; and
as a temperature of the Hall element varies, the internal resistance varies, while the feedback loop maintains the voltage at the center of the internal resistance at about the reference voltage, which causes voltages at the first and second bias terminals to remain about equidistant from the voltage at the center of the internal resistance, which prevents a voltage across the first and second Hall voltage terminals from substantially varying with the temperature.

8. A method for generating a Hall effect voltage, comprising:
applying a substantially constant bias current through a Hall element between first and second bias nodes;
maintaining a voltage at a point within the Hall element between the first and second bias nodes at about a constant voltage level utilizing a high gain amplifier controlling the bias current through the Hall element and through a pair of compensation resistors connected in series with the series connected compensation resistors being in parallel with the bias current path from the Hall element, wherein the voltage at the node between the first and second resistors substantially equals a reference voltage and substantially equals the voltage at the point within the Hall element; and generating the Hall effect voltage by the Hall element when in the presence of a magnetic field, wherein: as a temperature of the Hall element changes, an internal resistance thereof changes, which causes voltages at the first and second bias nodes to change in opposite directions to remain substantially equidistant from the voltage at the point within the Hall element.

9. The method of claim 8, wherein:

the point within the Hall element at which the voltage is maintained at about the constant voltage level is about at a midpoint between the first and second bias nodes.

10. The method of claim 8, wherein:

the first series resistor has about a same resistance as the second series resistor, which causes the voltage at the control node between the first and second series resistors to be about an average of voltages at the first and second bias nodes.

11. The method of claim 10, wherein:

resistances of the first and second resistors are at least an order of magnitude greater than an internal resistance of the Hall element.

12. The method of claim 11, wherein:

the first and second series resistors are made of a substantially same material as the Hall element.

* * * * *